(12) United States Patent
Kim et al.

(10) Patent No.: US 10,147,775 B2
(45) Date of Patent: Dec. 4, 2018

(54) DISPLAY SUBSTRATE, METHOD OF MANUFACTURING DISPLAY SUBSTRATE, AND DISPLAY DEVICE INCLUDING DISPLAY SUBSTRATE

(71) Applicant: Samsung Display Co., Ltd., Yongin-si, Gyeonggi-do (KR)

(72) Inventors: Ji-Hyun Kim, Suwon-si (KR); Sung-Kyun Park, Suwon-si (KR); Jeong-Min Park, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 83 days.

(21) Appl. No.: 15/156,120

(22) Filed: May 16, 2016

(65) Prior Publication Data
US 2017/0154934 A1    Jun. 1, 2017

(30) Foreign Application Priority Data
Nov. 27, 2015   (KR) ........................ 10-2015-0167444

(51) Int. Cl.
*H01L 27/32* (2006.01)
*H01L 51/52* (2006.01)
(Continued)

(52) U.S. Cl.
CPC ...... *H01L 27/3246* (2013.01); *H01L 27/3248* (2013.01); *H01L 27/3258* (2013.01);
(Continued)

(58) Field of Classification Search
CPC ............. H01L 27/3246; H01L 27/3262; H01L 27/3248; H01L 27/3258; H01L 51/525;
(Continued)

(56) References Cited

U.S. PATENT DOCUMENTS

| 2006/0043360 A1* | 3/2006 | Kim .................... H01L 27/3246 257/40 |
| 2009/0029514 A1* | 1/2009 | Yokoi ............... H01L 29/66765 438/293 |

(Continued)

FOREIGN PATENT DOCUMENTS

| KR | 10-2011-0081695 A | 7/2011 |
| KR | 10-2012-0019024 A | 3/2012 |
| KR | 10-1213492 B1 | 12/2012 |

*Primary Examiner* — Steven Loke
*Assistant Examiner* — Juanita Rhodes (57) ABSTRACT

A display substrate, a method of manufacturing the same, and a display device including the display substrate disclosed. In one aspect, the display substrate includes a pixel circuit disposed over a base substrate, an insulation layer disposed over the base substrate and overlapping the pixel circuit in the depth dimension of the display substrate, and a pixel electrode disposed over the insulation layer and electrically connected to the pixel circuit. The display substrate also includes a pixel defining layer disposed over the insulation layer, the pixel defining layer formed over a portion of the pixel electrode, and a spacer structure including a first spacer and a second spacer disposed over the first spacer, the first spacer being separated from the pixel circuit and disposed over the insulation layer.

18 Claims, 9 Drawing Sheets

(51) Int. Cl.
*H01L 51/00* (2006.01)
*H01L 27/12* (2006.01)

(52) U.S. Cl.
CPC ........ *H01L 27/3262* (2013.01); *H01L 51/525* (2013.01); *H01L 27/1225* (2013.01); *H01L 27/1248* (2013.01); *H01L 27/1288* (2013.01); *H01L 51/0011* (2013.01); *H01L 2227/323* (2013.01)

(58) Field of Classification Search
CPC ............. H01L 51/0011; H01L 27/1248; H01L 27/1288; H01L 27/1225; H01L 2227/323
See application file for complete search history.

(56) References Cited

U.S. PATENT DOCUMENTS

| | | | | |
|---|---|---|---|---|
| 2010/0045173 | A1* | 2/2010 | Kwon | H01L 27/3246 313/504 |
| 2011/0198596 | A1* | 8/2011 | Park | H01L 27/3246 257/59 |
| 2013/0334502 | A1* | 12/2013 | Liu | H01L 27/3265 257/40 |
| 2014/0117336 | A1* | 5/2014 | Kim | H01L 51/5246 257/40 |
| 2014/0353595 | A1* | 12/2014 | Choi | H01L 27/32 257/40 |
| 2014/0353599 | A1* | 12/2014 | Kang | H01L 27/3262 257/40 |

* cited by examiner

FIG. 18

DISPLAY SUBSTRATE, METHOD OF MANUFACTURING DISPLAY SUBSTRATE, AND DISPLAY DEVICE INCLUDING DISPLAY SUBSTRATE

CROSS-REFERENCE TO RELATED APPLICATION(S)

This application claims priority under 35 USC § 119 to Korean Patent Application No. 10-2015-0167444, filed on Nov. 27, 2015 in the Korean Intellectual Property Office (KIPO), the entire disclosure of which is incorporated by reference herein.

BACKGROUND

Field

The described technology generally relates to display substrates, methods of manufacturing the display substrates, and display devices including the display substrates.

Description of the Related Technology

Generally, a flat panel display device (e.g., liquid crystal display (LCD) device, organic light-emitting diode (OLED), etc.) includes a pair of electrodes generating an electric field and an electro-optical active layer therebetween. By way of contrast, the LCD device includes a liquid crystal layer as the electro-optical active layer, and the OLED includes an organic light emitting layer as the electro-optical active layer. One of the two electrodes receives an electrical signal, and the electro-optical active layer converts the electrical signal to an optical signal to display an image.

A display device can include a spacer that maintains a gap between a base substrate and an encapsulation substrate, and supports the encapsulation substrate. The spacer can be generally formed in a protruding form on a pixel defining layer. Typically, a photolithography process can be used to form the spacer, and a mask can be used in the photolithography process. However, the cost for manufacturing the display device can increase, and the manufacturing process can be complex when the photolithography process is performed using the mask to form the spacer.

SUMMARY OF CERTAIN INVENTIVE ASPECTS

One inventive aspect relates to a display substrate including a spacer structure that can effectively protect components of the display substrate.

Another aspect is a method of manufacturing the display substrate.

Another aspect is a display device including the display substrate.

Another aspect is a display substrate that can include a pixel circuit disposed on a base substrate, an insulation layer disposed over the base substrate to cover the pixel circuit, a pixel electrode disposed on the insulation layer and electrically connected to the pixel circuit, a pixel defining layer disposed on the insulation layer and exposing a portion of the pixel electrode, and a spacer structure including a first spacer separated from the pixel circuit and disposed on the insulation layer, and a second spacer disposed on the first spacer.

In example embodiments, the first spacer is integrally formed with the insulation layer.

In example embodiments, a height of the spacer structure is substantially greater than a height of the pixel defining layer.

In example embodiments, a height of the second spacer is substantially the same as the height of the pixel defining layer.

In example embodiments, the second spacer includes a material substantially the same as a material of the pixel defining layer.

In example embodiments, the display substrate further includes an auxiliary electrode disposed between the first spacer and the second spacer. The auxiliary electrode can be formed of a material substantially the same as a material of the pixel electrode.

In example embodiments, the pixel defining layer covers a side of the pixel electrode, and the second spacer covers a side of the auxiliary electrode.

Another aspect is a method of manufacturing a display substrate. A pixel circuit can be formed on a base substrate, and then an insulation layer can be formed over the base substrate to cover the pixel circuit. The insulation layer can be patterned using a first mask to form a contact hole exposing a portion of the pixel circuit and to form a first spacer separated from the pixel circuit. A pixel electrode layer can be formed on the insulation layer, and then a preliminary pixel defining layer can be formed on the pixel electrode layer. The preliminary pixel defining layer and the pixel electrode layer can be patterned using a second mask to form a second spacer on the first spacer and to form a pixel electrode and a pixel defining layer on the insulation layer over the pixel circuit.

In example embodiments, the first mask includes a first portion substantially transmitting light, a second portion partially transmitting light, and a third portion blocking light.

In example embodiments, the first portion substantially corresponds to the contact hole of the insulation layer, and the third portion substantially corresponds to the first spacer of the insulation layer.

In example embodiments, the second mask includes a fourth portion substantially transmitting light, a fifth portion partially transmitting light, and a sixth portion blocking light.

In example embodiments, the fifth portion substantially corresponds to the pixel electrode, and the sixth portion can substantially correspond to the pixel defining layer and the second spacer.

In the patterning of the insulation layer according to example embodiments, the first mask is disposed over the insulation layer, and then the insulation layer is exposed to light. The insulation layer can be selectively removed to form the first spacer and the contact hole.

In the patterning of the preliminary pixel defining layer and the pixel electrode layer according to example embodiments, the second mask can be disposed over the preliminary pixel defining layer, and then the preliminary pixel defining layer can be exposed to light. The exposed preliminary pixel defining layer can be selectively removed, and then the pixel electrode layer can be selectively removed to form the pixel electrode.

In the selectively removing of the exposed preliminary pixel defining layer according to example embodiments, the exposed preliminary pixel defining layer can be selectively removed such that a portion of the exposed preliminary pixel defining layer corresponding to a center portion of the pixel electrode can remain with a relatively thin thickness, a portion of the exposed preliminary pixel defining layer corresponding to a peripheral portion of the pixel electrode and the first spacer can remain with a relatively thick thickness, and a remaining portion of the exposed preliminary pixel defining layer can be removed. The preliminary pixel defining layer can be cured. The portion of the exposed preliminary pixel defining layer corresponding to the center portion of the pixel electrode can be removed.

In the selectively removing of the pixel electrode layer according to example embodiments, an auxiliary electrode can be formed between the first spacer and the second spacer.

In the forming of the pixel circuit according to example embodiments, after an active pattern can be formed on the base substrate, a first gate insulation layer can be formed on the base substrate to cover the active pattern. After a first gate electrode can be formed on the first insulation layer, a second gate insulation layer can be formed on the first gate insulation layer to cover the first gate electrode. A second gate electrode can be formed on the second gate insulation layer, and then an insulation interlayer can be formed on the second gate insulation layer to cover the second gate electrode. After a contact holes formed through the insulation interlayer, the first gate insulation layer and the second gate insulation layer, a source electrode and a drain electrode can be formed on the insulation interlayer while filling the contact holes.

Another aspect is a display device that includes a pixel circuit disposed on a base substrate, an insulation layer disposed over the base substrate to cover the pixel circuit, a pixel electrode disposed on the insulation layer and electrically connected to the pixel circuit, a pixel defining layer disposed on the insulation layer and exposing a portion of the pixel electrode, a spacer structure including a first spacer separated from the pixel circuit and disposed on the insulation layer, and a second spacer disposed on the first spacer, an organic light emitting layer disposed on the exposed portion of the pixel electrode, and a common electrode disposed on the insulation layer, the organic light emitting layer, the pixel defining layer and the second spacer.

In example embodiments, the second spacer includes a material substantially the same as a material of the pixel defining layer, and a height of the second spacer is substantially the same as a height of the pixel defining layer.

In example embodiments, the display device further includes an auxiliary electrode disposed between the first spacer and the second spacer. The auxiliary electrode can include a material substantially the same as a material of the pixel electrode.

Another aspect is a display substrate comprising: a pixel circuit disposed over a base substrate; an insulation layer disposed over the base substrate and overlapping the pixel circuit in the depth dimension of the display substrate; a pixel electrode disposed over the insulation layer and electrically connected to the pixel circuit; a pixel defining layer disposed over the insulation layer, the pixel defining layer formed over a portion of the pixel electrode; and a spacer structure including a first spacer and a second spacer disposed over the first spacer, the first spacer being separated from the pixel circuit and disposed over the insulation layer.

In the above display substrate, the first spacer is integrally formed with the insulation layer.

In the above display substrate, the spacer structure has a height greater than that of the pixel defining layer.

In the above display substrate, the second spacer has the same height as that of the pixel defining layer.

In the above display substrate, the second spacer is formed of the same material as the pixel defining layer.

The above display substrate further comprises an auxiliary electrode disposed between the first and second spacers, wherein the auxiliary electrode is formed of the same material as the pixel electrode.

In the above display substrate, the pixel defining layer covers a side of the pixel electrode, and wherein the second spacer covers a side of the auxiliary electrode.

Another aspect is a method of manufacturing a display substrate, the method comprising: forming a pixel circuit over a base substrate; forming an insulation layer over the base substrate and overlapping the pixel circuit in the depth dimension of the display substrate; patterning the insulation layer via a first mask to form a contact hole exposing a portion of the pixel circuit and to form a first spacer separated from the pixel circuit; forming a pixel electrode layer over the insulation layer; forming a preliminary pixel defining layer over the pixel electrode layer; and patterning the preliminary pixel defining layer and the pixel electrode layer via a second mask to form a second spacer over the first spacer, and to form a pixel electrode and a pixel defining layer over the insulation layer and the pixel circuit.

In the above method, the first mask includes a first portion configured to transmit light, a second portion configured to partially transmit light, and a third portion configured to block light.

In the above method, the first portion corresponds to the contact hole of the insulation layer, wherein the third portion corresponds to the first spacer of the insulation layer.

In the above method, the second mask includes a fourth portion configured to transmit light, a fifth portion configured to partially transmit light and a sixth portion configured to block light.

In the above method, the fifth portion is configured to be placed over the pixel electrode, wherein the sixth portion is configured to be placed over the pixel defining layer and the second spacer.

In the above method, patterning the insulation layer comprises: disposing the first mask over the insulation layer; exposing the insulation layer to light; and selectively removing the exposed insulation layer to form the first spacer and the contact hole.

In the above method, patterning the preliminary pixel defining layer and the pixel electrode layer comprises: disposing the second mask over the preliminary pixel defining layer; exposing the preliminary pixel defining layer to light; selectively removing the exposed preliminary pixel defining layer; and selectively removing the pixel electrode layer to form the pixel electrode.

In the above method, selectively removing the exposed preliminary pixel defining layer comprises: selectively removing the exposed preliminary pixel defining layer such that a portion of the exposed preliminary pixel defining layer is configured to be placed over a center portion of the pixel electrode remains with a first thickness, a portion of the exposed preliminary pixel defining layer is configured to be placed over a peripheral portion of the pixel electrode and the first spacer remains with a second thickness less than the first thickness, and a remaining portion of the exposed preliminary pixel defining layer is removed; curing the exposed preliminary pixel defining layer; and removing the portion of the exposed preliminary pixel defining layer is configured to be placed over the center portion of the pixel electrode.

In the above method, selectively removing the pixel electrode layer comprises forming an auxiliary electrode between the first spacer and the second spacer.

In the above method, forming the pixel circuit comprises: forming an active pattern over the base substrate; forming a first gate insulation layer over the base substrate so as to cover the active pattern; forming a first gate electrode over the first gate insulation layer; forming a second gate insulation layer over the first gate insulation layer so as to cover the first gate electrode; forming a second gate electrode over the second gate insulation layer; forming an insulation interlayer over the second gate insulation layer so as to cover the second gate electrode; forming a plurality of contact holes through the insulation interlayer, the first gate insulation layer and the second gate insulation layer; and forming a source electrode and a drain electrode over the insulation interlayer and filling the contact holes.

Another aspect is a display device comprising: a pixel circuit disposed over a base substrate; an insulation layer disposed over the base substrate so as to cover the pixel circuit; a pixel electrode disposed over the insulation layer and electrically connected to the pixel circuit; a pixel defining layer disposed over the insulation layer, the pixel defining layer formed over only a portion of the pixel electrode such that at least part of the remaining portion of the pixel electrode is not covered by the pixel defining layer; a spacer structure including a first spacer and a second spacer disposed over the first spacer, the first spacer being separated from the pixel circuit and disposed over the insulation layer; an organic light-emitting layer disposed the remaining portion of the pixel electrode; and a common electrode disposed over the insulation layer, the organic light-emitting layer, the pixel defining layer and the second spacer.

In the above display device, the second spacer is formed of the same material as the pixel defining layer, wherein the second spacer has the same height as that of the pixel defining layer.

The above display device further comprises an auxiliary electrode disposed between the first and second spacers, wherein the auxiliary electrode is formed of the same material as the pixel electrode.

In the above display device, the first spacer has a top surface, wherein the second spacer has a bottom surface contacting the top surface of the first spacer, and wherein the top surface of the first spacer and the bottom surface of the second spacer have the same width.

In the above display device, the first spacer is thicker than each of the pixel and auxiliary electrodes.

The above display device further comprises an auxiliary electrode formed between the first and second spacers and formed of the same material as the pixel electrode, wherein each of the auxiliary and pixel electrodes has a bottom surface, and wherein the bottom surface of the pixel electrode is closer to the base substrate than the bottom surface of the auxiliary electrode.

According to at least one of the disclosed embodiments, the display substrate can include the first spacer integrally formed with the insulation layer, and the second spacer disposed on the first spacer, so that the display substrate can have the spacer structure with an enough thickness for effectively protecting the components of the display substrate. Moreover, the number of masks for manufacturing the insulation layer, the pixel electrode, the pixel defining layer and the spacer structure can be reduced, such that the cost for manufacturing the display substrate can be reduced.

DETAILED DESCRIPTION OF CERTAIN INVENTIVE EMBODIMENTS

Hereinafter, display substrates, methods of manufacturing the display substrates, and display devices including the display substrates in accordance with example embodiments will be explained in detail with reference to the accompanying drawings. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 1:
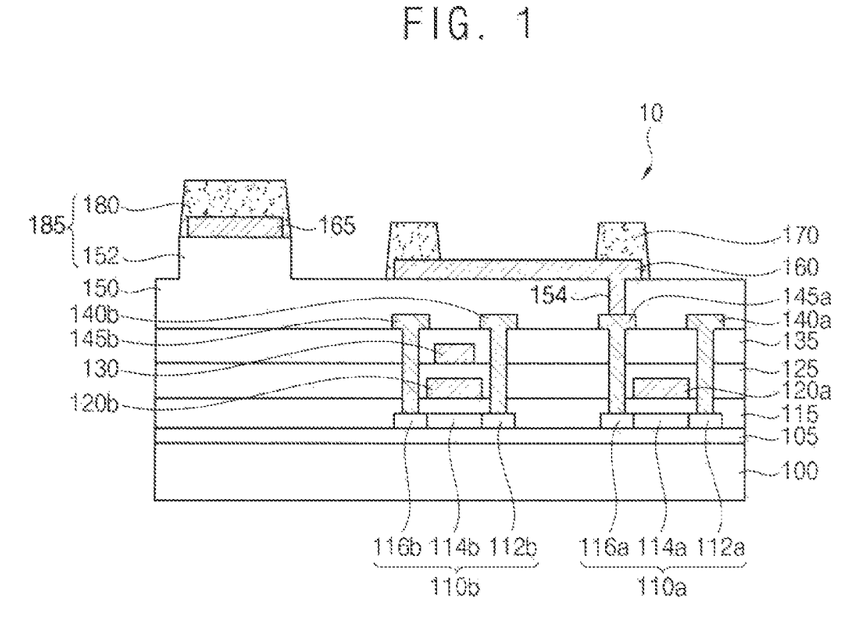
FIG. 1 is a cross-sectional view illustrating a display substrate in accordance with example embodiments.

FIG. 1 is a cross-sectional view illustrating a display substrate 10 in accordance with example embodiments.

Referring to FIG. 1, the display substrate 10 includes a base substrate 100, a pixel circuit, an insulation layer 150, a pixel electrode 160, a pixel defining layer 170, a spacer structure 185, etc. In example embodiments, the spacer structure 185 includes a first spacer 152 and a second spacer 180. For example, the first spacer 152 is integrally formed with the insulation layer 150, and the second spacer 180 is positioned on the first spacer 152.

In example embodiments, the pixel circuit includes a driving transistor and a switching transistor. For example, each of the driving transistor and the switching transistor is a thin film transistor (TFT). The driving transistor can include a first active pattern 110$a$, a first gate electrode 120$a$, a first source electrode 140$a$ and a first drain electrode 145$a$. In addition, the switching transistor can include a second active pattern 110$b$, a second gate electrode 120$b$, a third gate electrode 130, a second source electrode 140$b$ and a second drain electrode 145$b$.

The base substrate 100 can include a transparent substrate such as a glass substrate, a quartz substrate, a transparent plastic substrate, etc. For example, the transparent plastic substrate, which can be used as the base substrate 100, is formed of polyimide, acryl, polyethylene terephthalate, polycarbonate, polyacrylate, polyether, etc. Alternatively, the base substrate 100 can include a flexible substrate.

A buffer layer 105 can be disposed on the base substrate 100. The buffer layer 105 can prevent diffusion of impurities from the base substrate 100 toward upper structures. The buffer layer 105 can control a transfer rate of heat in a crystallization process for forming the first and the second active patterns 110$a$ and 110$b$. For example, the buffer layer 105 includes silicon oxide (SiOx), silicon nitride (SiNx), silicon oxynitride (SiOxNy), etc. The buffer layer 100 can have a single layer structure or a multi-layer structure. In some example embodiments, the buffer layer 105 is omitted.

The first and second active patterns 110$a$ and 110$b$ can be disposed on the buffer layer 105. In example embodiments, each of the first and the second active patterns 110$a$ and 110$b$ is formed of a silicon compound or polysilicon. A first source region 112$a$ and a first drain region 116$a$, each of which includes impurities, can be formed on both sides of the first active pattern 110$a$. A second source region 112$b$ and a second drain region 116b, each of which includes impurities, can be formed on both sides of the second active pattern 110b.

In some example embodiments, each of the first and the second active patterns 110a and 110b is formed of an oxide semiconductor such as indium-gallium-zinc oxide (IGZO), zinc-tin oxide (ZTO), or indium-tin-zinc oxide (ITZO).

Referring to FIG. 1 again, a first gate insulation layer 115 is disposed on the buffer layer 105 to substantially cover the first and the second active patterns 110a and 110b. For example, the first gate insulation layer 115 is formed of silicon oxide, silicon nitride, silicon oxynitride, etc. The first gate insulation layer 115 can have a single layer structure or a multi-layer structure.

The first and second gate electrodes 120a and 120b can be disposed on the first gate insulation layer 115. The first and second gate electrodes 120a and 120b can substantially overlap the first and second active patterns 110a and 110b, respectively. Each of the first and the second gate electrodes 120a and 120b can be formed of a metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), alloys thereof, nitrides thereof, etc. These can be used alone or in a combination thereof. In some example embodiments, each of the first and the second gate electrodes 120a and 120b has a double-layered structure such as an Al/Mo structure or a Ti/Cu structure so as to reduce a resistance thereof.

A second gate insulation layer 125 can be disposed on the first gate insulation layer 115 to substantially cover the first and the second gate electrodes 120a and 120b. For example, the second gate insulation layer 125 is formed of silicon oxide, silicon nitride and/or silicon oxynitride, and has a single layer structure or a multi-layer structure similar to the structure of the first gate insulation layer 115.

The third gate electrode 130 can be disposed on the second gate insulation layer 125. The third gate electrode 130 can substantially overlap the second gate electrode 120b. The third gate electrode 130 can be formed of a metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), alloys thereof, nitrides thereof, etc. These can be used alone or in a combination thereof. In some example embodiments, the third gate electrode 130 has a double-layered structure such as an Al/Mo structure or a Ti/Cu structure so as to reduce a resistance thereof.

A insulation interlayer 135 can be disposed on the second gate insulation layer 125 to substantially cover the third gate electrode 130. For example, the insulation interlayer 135 is formed of silicon oxide, silicon nitride, silicon oxynitride, etc. The insulation interlayer 135 can have a single layer structure or a multi-layer structure.

The first source electrode 140a, the second source electrode 140b, the first drain electrode 145a, and the second drain electrode 145b can be disposed on the insulation interlayer 135. Each of the first source electrode 140a and the first drain electrode 145a can pass through the insulation interlayer 135, the second gate insulation layer 125 and the first gate insulation layer 115 to thereby contact the first active pattern 110a. Each of the second source electrode 140b and the second drain electrode 145b can pass through the insulation interlayer 135, the second gate insulation layer 125 and the first gate insulation layer 115 to thereby contact the second active pattern 110b. Each of the first and the second source electrodes 140a and 140b and the first and the second drain electrodes 145a and 145b can be formed of aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), alloys thereof, nitrides thereof, etc. These can be used alone or in a combination thereof. In some example embodiments, each of the first and the second source electrodes 140a and 140b and the first and the second drain electrodes 145a and 145b includes at least two different metal layers, for example, an Al layer and a Mo layer.

The first source electrode 140a and the first drain electrode 145a can contact the first source region 112a and the first drain region 116a of the first active pattern 110a, respectively. The second source electrode 140b and the second drain electrode 145b can contact the second source region 112b and the second drain region 116b of the second active pattern 110b, respectively. In this case, a portion of the first active pattern 110a between the first source region 112a and the first drain region 116a can be defined as a first channel region 114a through which charges can move, and a portion of the second active pattern 110b between the second source region 112b and the second drain region 116b can be defined as a second channel region 114b through which charges can move. The first channel region 114a can substantially overlap the first gate electrode 120a, and the second channel region 114b can substantially overlap the second gate electrode 120b.

As illustrated in FIG. 1, the insulation layer 150 is disposed on the insulation interlayer 135. The insulation layer 150 can substantially cover the first and the second source electrodes 140a and 140b, and the first and the second drain electrodes 145a and 145b. A via structure for electrically connecting the pixel electrode 160 and the first drain electrode 145a can be provided in the insulation layer 150. In example embodiments, a contact hole 154 that exposes a portion of the first drain electrode 145a is provided in the insulation layer 150, and the pixel electrode 160 fills the contact hole 154 to contact the first drain electrode 145a. In some example embodiments, a contact (not illustrated) having a conductive material is provided in the contact hole 154, and the pixel electrode 160 and the first drain electrode 145a contact an upper portion and an lower portion of the contact, respectively. Furthermore, the insulation layer 150 substantially serves as a planarization layer for upper structures. For example, the insulation layer 150 is formed of an organic material such as polyimide, epoxy-based resin, acryl-based resin, polyester, or the like.

The insulation layer 150 can include the first spacer 152 extending to a direction perpendicular to (or crossing) the base substrate 100. The first spacer 152 can be separated from the pixel electrode 160 in a predetermined distance. For example, the first spacer 152 is located a predetermined distance away from the pixel circuit. The first spacer 152 and the second spacer 180 that will be explained below can compose the spacer structure 185 that protects the display substrate 10. A manufacturing process of the insulation layer 150 including the first spacer 152 will be explained below in detail with reference to FIGS. 9 to 11.

Referring to FIG. 1 again, the pixel electrode 160 is disposed on the insulation layer 150. As mentioned above, the pixel electrode 160 can fill the contact hole 154 to contact the first drain electrode 145a, or the pixel electrode 160 can be electrically connected to the first drain electrode 145a through the contact provided in the contact hole 154.

In example embodiments, the pixel electrode 160 serves as a reflective electrode in a display device. For example, the pixel electrode 160 is formed of aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), or alloys thereof. In some example embodiments, the pixel electrode 160 is formed of a transparent conductive material. For example, the pixel electrode 160 is formed of indium tin oxide (ITO), indium zinc oxide (IZO), zinc oxide, or indium oxide. Alternatively, the pixel electrode 160 can have a multi-layered structure including the aforementioned transparent conductive material and metal.

The pixel defining layer 170 can be spaced apart from the first spacer 152 and disposed on the pixel electrode 160 and the insulation layer 150. A pixel opening that exposes a center portion of the pixel electrode 160 can be provided in the pixel defining layer 170. The pixel defining layer 170 can be formed of a transparent organic material such as polyimide resin or acryl resin.

The second spacer 180 can be disposed on the first spacer 152 integrally formed with the insulation layer 150. As mentioned above, the second spacer 180, along with the first spacer 152, can provide the spacer structure 185 that protects the display substrate 10. In example embodiments, the pixel defining layer 170 and the second spacer 180 are substantially simultaneously (or concurrently) formed using a halftone mask. Manufacturing processes of the pixel electrode 160, the pixel defining layer 170 and the second spacer 180 can be explained below in detail with reference to FIGS. 12 to 17.

In example embodiments, an addition of a height of the first spacer 152 and a height of the second spacer 180 can be substantially greater than a height of the pixel defining layer 170. For example, the spacer structure 185 has a substantially greater height than the pixel defining layer 170. In this case, the second spacer 180 and the pixel defining layer 170 can have substantially the same height. Therefore, the difference between the height of the spacer structure 185 and the height of the pixel defining layer 170 can substantially correspond to the height of the first spacer 152. When the first spacer 152 has an enough height, the display substrate 10 can include the spacer structure 185 having an enough height to be distinguished with the pixel defining layer 170.

Referring to FIG. 1 again, the pixel defining layer 170 and the second spacer 180 are formed of the same material. For example, each of the pixel defining layer 170 and the second spacer 180 is formed of a transparent organic material such as polyimide resin or acryl resin.

In example embodiments, an auxiliary electrode 165 is interposed between the first spacer 152 and the second spacer 180. The auxiliary electrode 165 can be formed of the same material as the pixel electrode 160.

Figure 2:
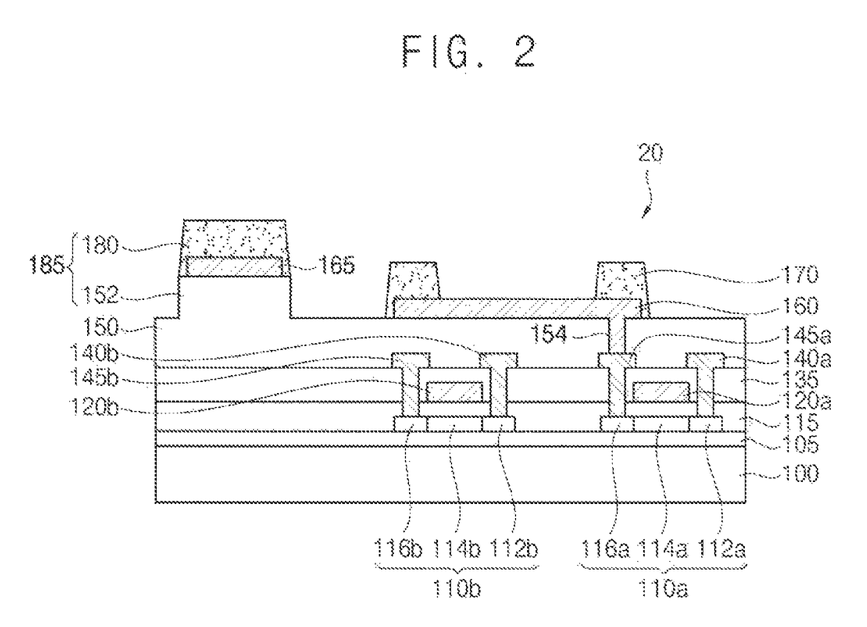
FIG. 2 is a cross-sectional view illustrating a display substrate in accordance with some example embodiments.

FIG. 2 is a cross-sectional view illustrating a display substrate 20 in accordance with some example embodiments. In the display substrate 20 illustrated in FIG. 2, the second gate insulation layer 125 and the third gate electrode 130 illustrated in FIG. 1 can be omitted, such that the display substrate 20 can have a more simple circuit structure than that in FIG. 1. Except the omitted elements, the display substrate 20 can be the same as or similar to the display substrate 10 in FIG. 1.

As explained above, the display substrate 20 according to example embodiments can include the spacer structure 185 having the first spacer 152 integrally formed with the insulation layer 150 and the second spacer 180 substantially simultaneously formed with the pixel defining layer 170 and disposed on the first spacer 152. Therefore, the spacer structure 185 can maintain a predetermined distance between the display substrate, and a deposition mask or an encapsulation substrate which are disposed on the display substrate, and the spacer structure 185 can effectively protect elements (e.g., layers, circuits, etc.) of the display substrate from pressure or impact.

FIGS. 3 to 17 are cross-sectional views illustrating a method of manufacturing a display substrate in accordance with example embodiments.

Figure 3:
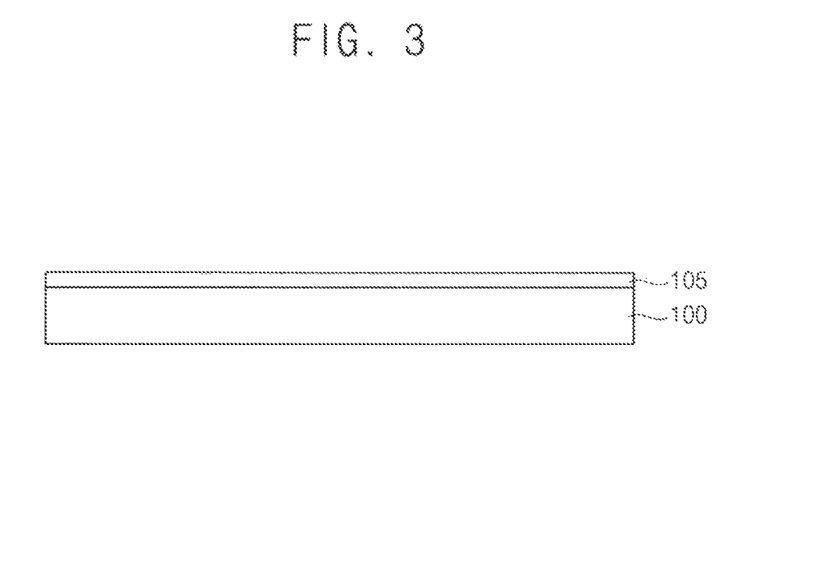
FIGS. 3, 4, 5, 6, 7, 8, 9, 10, 11, 12, 13, 14, 15, 16 and 17 are cross-sectional views illustrating a method of manufacturing a display substrate in accordance with example embodiments.

Referring to FIG. 3, a buffer layer 105 is formed on a base substrate 100. The buffer layer 105 can be formed by a chemical vapor deposition (CVD) process, a plasma enhanced chemical vapor deposition (PECVD) process, a high density plasma-chemical vapor deposition (HDP-CVD) process, etc. For example, the base substrate 100 is loaded in a process chamber, and then a silicon oxide precursor, a nitrogen source, etc. is introduced onto the base substrate 100 to form the buffer layer 105.

Figure 4:
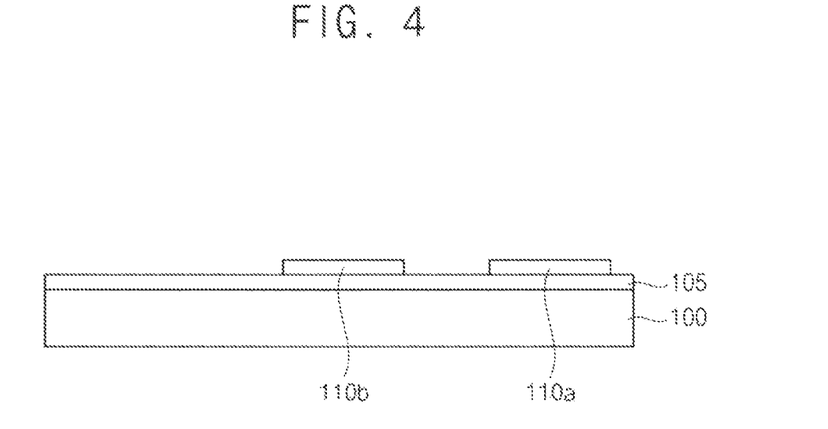

Referring to FIG. 4, a first active pattern 110a and a second active pattern 110b are formed on the buffer layer 105. For example, a semiconductor layer is formed on the buffer layer 105 of amorphous silicon or polysilicon, and then the semiconductor layer can be patterned to form the first and the second active patterns 110a and 110b on the buffer layer 105. In example embodiments, a crystallization process such as a low temperature polycrystalline silicon (LTPS) or a laser crystallization process can be performed for the semiconductor layer after the formation of the semiconductor layer. In some example embodiments, the first and the second active patterns 110a and 110b is formed of oxide semiconductor such as IGZO, ZTO, ITZO, etc.

Figure 5:
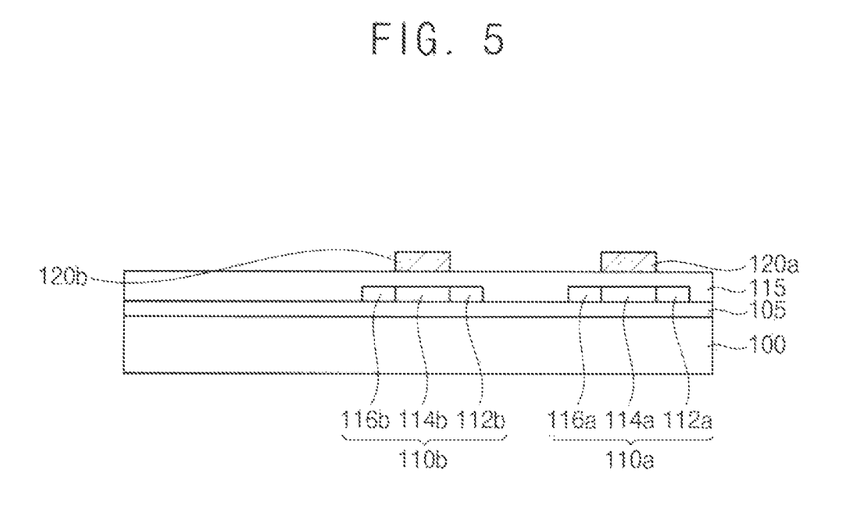

Referring to FIG. 5, a first gate insulation layer 115 is formed on the buffer layer 105 to cover the first and the second active patterns 110a and 110b, and then a first gate electrode 120a and a second gate electrode 120b are formed on the first gate insulation layer 115. For example, after a first conductive layer is formed on the first gate insulation layer 115, the first conductive layer is etched by, e.g., a photolithography process to form the first and the second gate electrodes 120a and 120b on the first gate insulation layer 115. Here, the first conductive layer can be formed of metal, alloy or metal nitride. Alternatively, the first conductive layer can be formed by depositing a plurality of metal layers on the first gate insulation layer 115. The first and second gate electrodes 120a and 120b can be substantially located on portions of the first gate insulation layer 115 where the first and second active patterns 110a and 110b are positioned, respectively.

In example embodiments, impurities are implanted into the first and the second active patterns 110a and 110b by using the first and the second gate electrodes 120a and 120b as ion implantation masks, such that a first source region 112a and a first drain region 116a can be formed at both sides of the first active pattern 110a, and a second source region 112b and a second drain region 116b can be formed at both sides of the second active pattern 110b.

Figure 6:
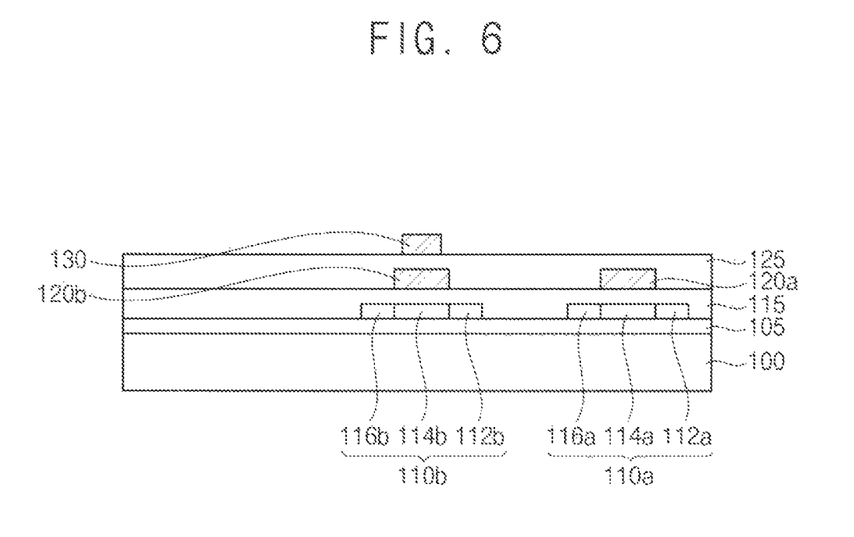

Referring to FIG. 6, a second gate insulation layer 125 is formed on the first gate insulation layer 115 to cover the first and the second gate electrodes 120a and 120b, and then a third gate electrode 130 is formed on the second gate insulation layer 125. For example, after a second conductive layer is formed on the second gate insulation layer 125, the second conductive layer is etched by, e.g., a photolithography process to form the third gate electrode 130 on the second gate insulation layer 125. Here, the second conductive layer can be formed of metal, alloy or metal nitride. Alternatively, the second conductive layer can be formed by depositing a plurality of metal layers on the second gate insulation layer 125. The third gate electrode 130 can be substantially located on portions of the second gate insulation layer 125 where the second gate electrode 120b is positioned.

Figure 7:
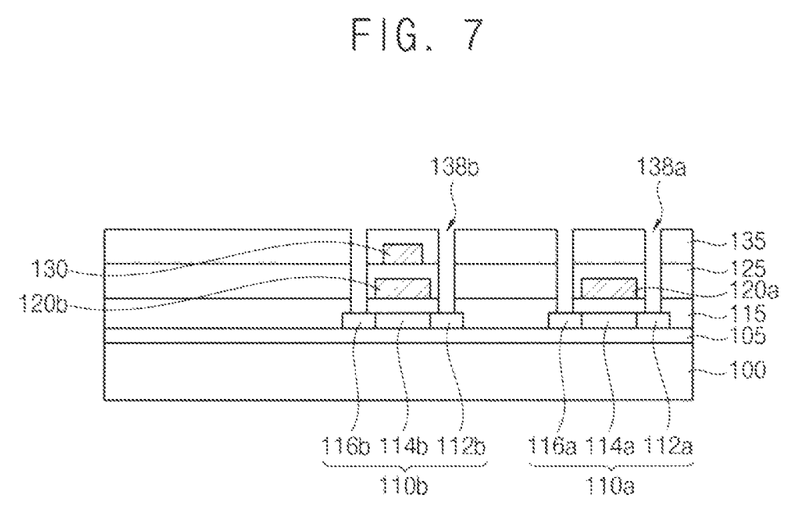

Referring to FIG. 7, an insulation interlayer 135 is formed on the second gate insulation layer 125 to cover the third gate electrode 130. Then the insulation interlayer 135, the second gate insulation layer 125 and the first gate insulation layer 115 can be partially etched to form a first contact hole 138a exposing a portion of the first active pattern 110a and a second contact hole 138b exposing a portion of the second active pattern 110b. For example, the insulation interlayer 135, the second gate insulation layer 125 and the first gate insulation layer 115 are partially etched by a photolithography process using a mask to form the first and the second contact holes 138a and 138b.

Figure 8:
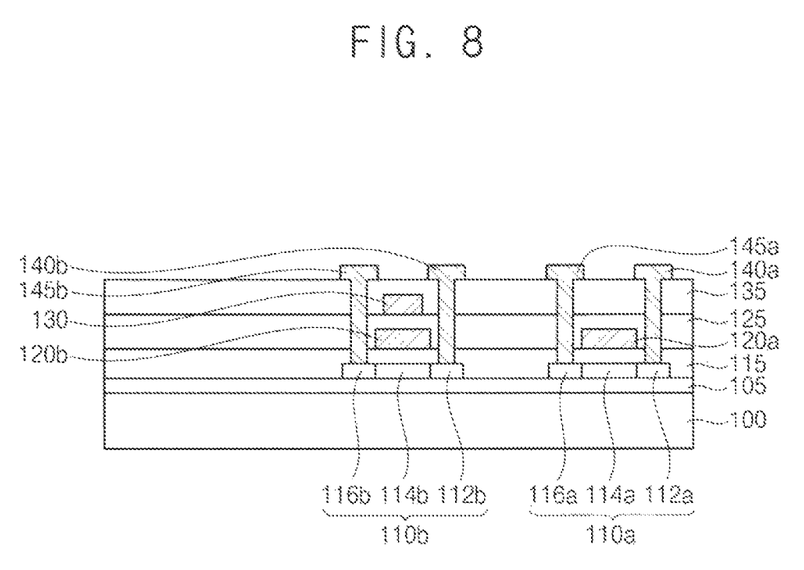

Referring to FIG. 8, a first source electrode 140a and a first drain electrode 145a which pass through the insulation interlayer 135, the second gate insulation layer 125 and the first gate insulation layer 115 to contact the first active pattern 110a are formed. A second source electrode 140b and a second drain electrode 145b which pass through the insulation interlayer 135, the second gate insulation layer 125 and the first gate insulation layer 115 to contact the second active pattern 110b can be formed. For example, after forming a third conductive layer on the insulation interlayer 135 to fill the first and the second contact holes 138a and 138b, the third conductive layer can be patterned to form the first and the second source electrodes 140a and 140b and the first and the second drain electrodes 145a and 145b. Here, the third conductive layer can be formed of metal, alloy or metal nitride. Alternatively, the third conductive layer can be formed by depositing a plurality of metal layers on the insulation interlayer 135.

Figure 9:
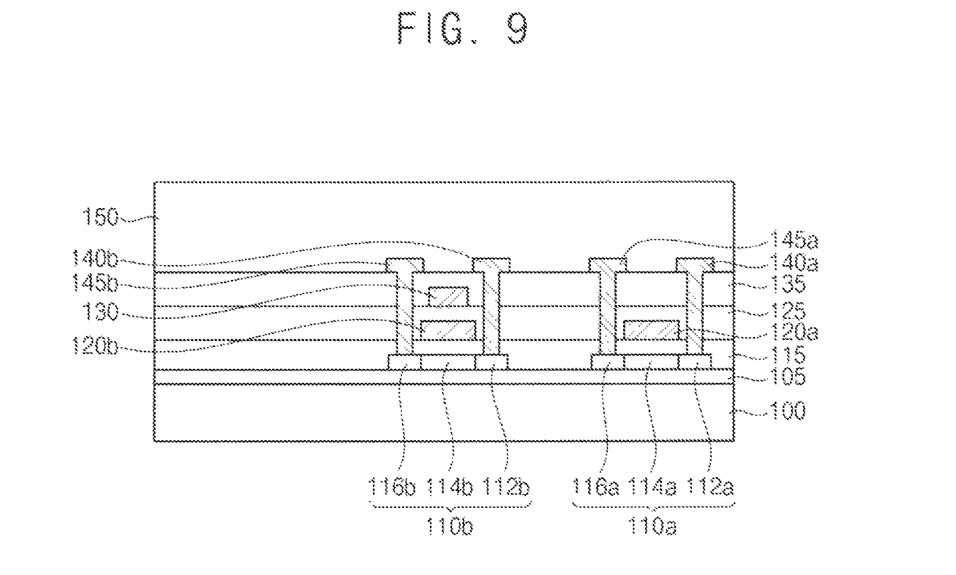

Referring to FIG. 9, an insulation layer 150 is formed on the insulation interlayer 135 to cover the first and the second source electrodes 140a and 140b, and the first and the second drain electrodes 145a and 145b. For example, the insulation layer 150 is formed of an organic material such as photoresist, polyimide, epoxy-based resin, acryl-based resin, polyester, etc. The insulation layer 150 can be formed with a thickness enough to have a substantially flat top surface. The insulation layer 150, for example, is formed by a spin coating process or a printing process.

Figure 10:
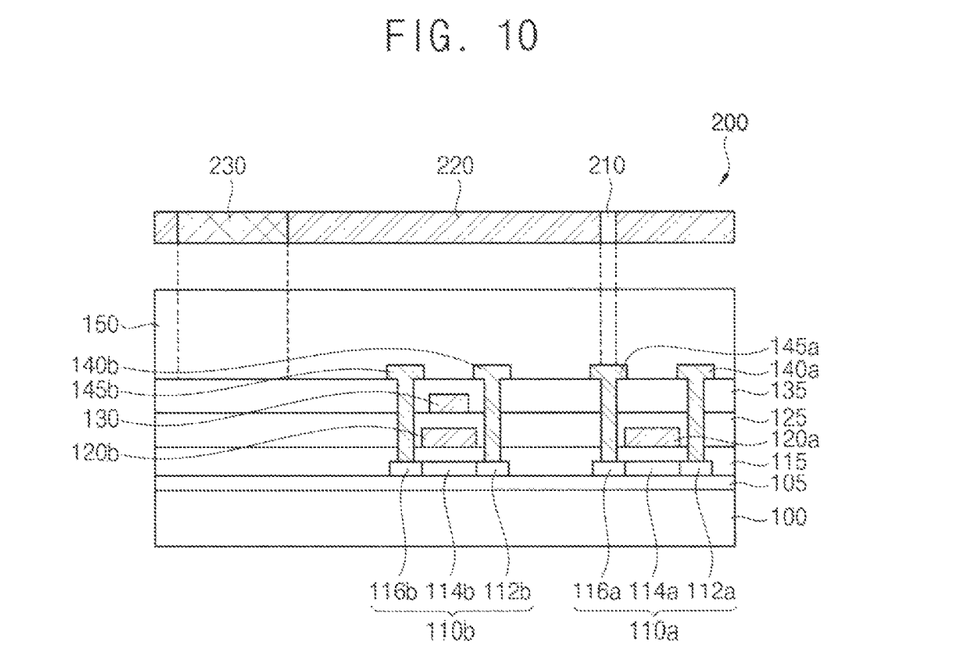

Referring to FIG. 10, a first mask 200 is disposed over the insulation layer 150, and then an exposure process is performed onto the insulation layer 150. In example embodiments, the first mask 200 includes a halftone mask or a halftone slit mask, and the insulation layer 150 is formed using positive photoresist. The first mask 200 can include a first portion 210 substantially transmitting light, a second portion 220 partially transmitting light, and a third portion 230 blocking light. Here, the first portion 210 can correspond to an area of the insulation layer 150 where a contact hole 154 in FIG. 11 will be formed, the third portion 230 can correspond to an area of the insulation layer 150 where a first spacer 152 in FIG. 11 will be formed, and the second portion 220 can correspond to a remaining area of the insulation layer 150.

Figure 11:
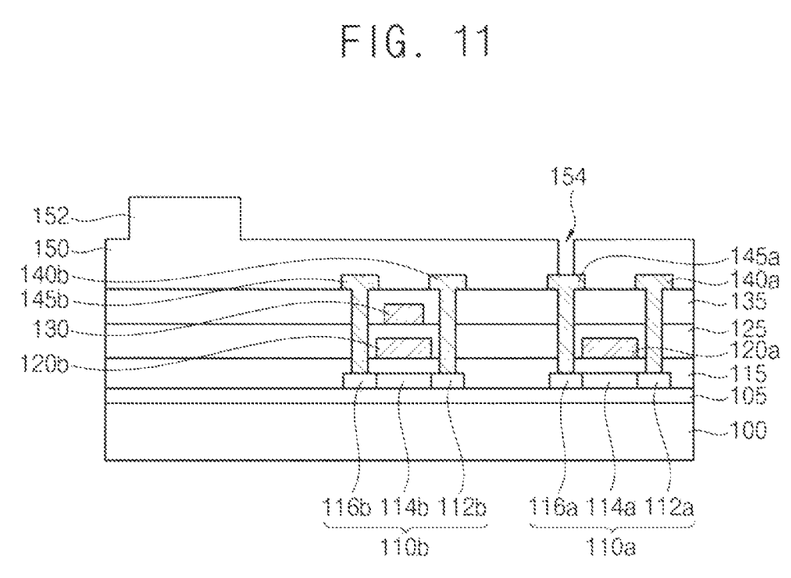

Referring to FIG. 11, the exposed areas of the insulation layer 150 by the first mask 200 are removed to form the first spacer 152 and the contact hole 154. For example, a first area of the insulation layer 150 which is exposed to light transmitting the first portion 210 of the first mask 200 is entirely removed to form the contact hole 154 that exposes a portion of the first drain electrode 145a. A second area of the insulation layer 150 which is exposed to light transmitting the second portion 220 of the first mask 200 can be partially removed and have a substantially flat top surface. The first spacer 152 extending to a direction perpendicular to (or crossing) the base substrate 100 can be formed in the third area of the insulation layer 150 which is not exposed to light by the third portion 230 of the first mask 200. Here, the first spacer 152 can be integrally formed with the insulation layer 150.

Figure 12:
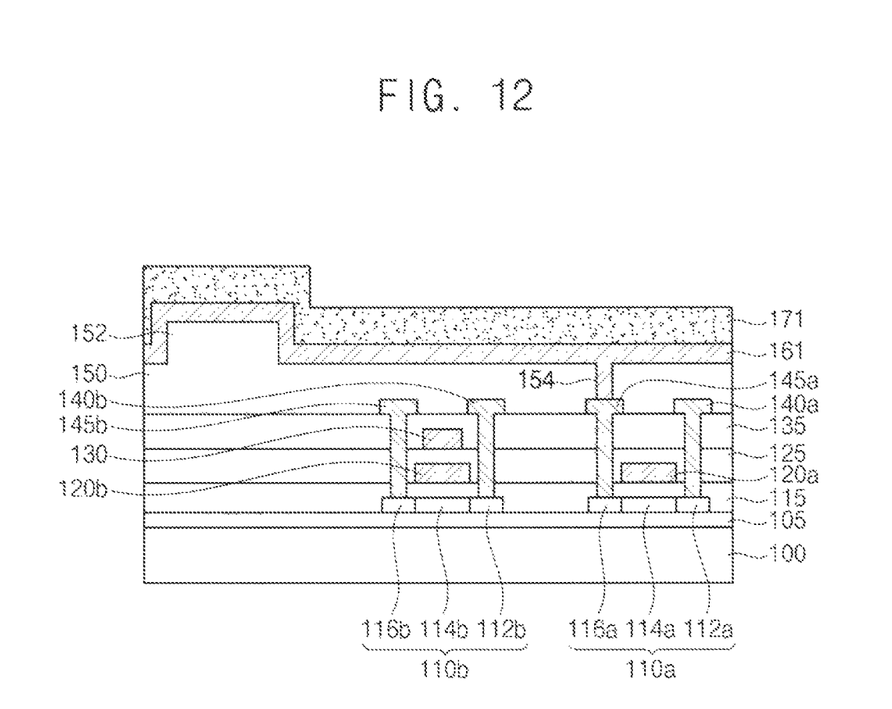

Referring to FIG. 12, a pixel electrode layer 161 is formed on the insulation layer 150 to fill the contact hole 154, and then a preliminary pixel defining layer 171 is formed on the pixel electrode layer 161. Here, the pixel electrode layer 161 and the preliminary pixel defining layer 171 can be formed on the first spacer 152 of the insulation layer 150, and a protruding portion can be formed on each of the pixel electrode layer 161 and the preliminary pixel defining layer 171 along a profile of the first spacer 152. For example, the pixel electrode layer 161 is formed of aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), or alloys thereof. For example, the preliminary pixel defining layer 171 is formed by a vacuum deposition process, a sputtering process, an atomic layer deposition (ALD) process, a CVD process, a printing process, etc. Alternatively, the pixel electrode layer 161 can be formed of a transparent conductive material such as indium tin oxide (ITO), indium zinc oxide (IZO), zinc oxide, indium oxide, etc. The preliminary pixel defining layer 171, for example, is formed by applying a photosensitive material such as photoresist, polyimide resin, acryl resin, etc.

Figure 13:
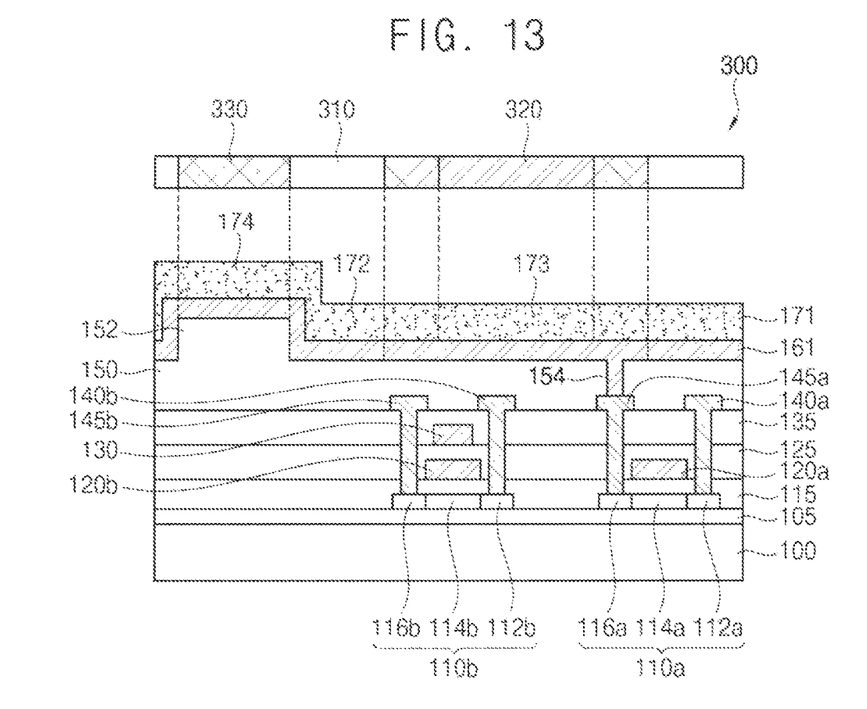

Referring to FIG. 13, a second mask 300 is disposed over the preliminary pixel defining layer 171, and then an exposure process is performed onto the preliminary pixel defining layer 171. In example embodiments, the second mask 300 includes a halftone mask or a halftone slit mask, and the preliminary pixel defining layer 171 is formed using positive photoresist. The second mask 300 can include a fourth portion 310 substantially transmitting light, a fifth portion 320 partially transmitting light, and a sixth portion 330 blocking light. Here, the fourth portion 310 can correspond to an area in FIG. 15 where the pixel electrode layer 161 will be removed, the fifth portion 320 can correspond to an area in FIG. 17 where a pixel electrode 160 will be exposed, and the sixth portion 330 can correspond to an area in FIG. 17 where a pixel defining layer 170 and a second spacer 180 will be formed.

Figure 14:
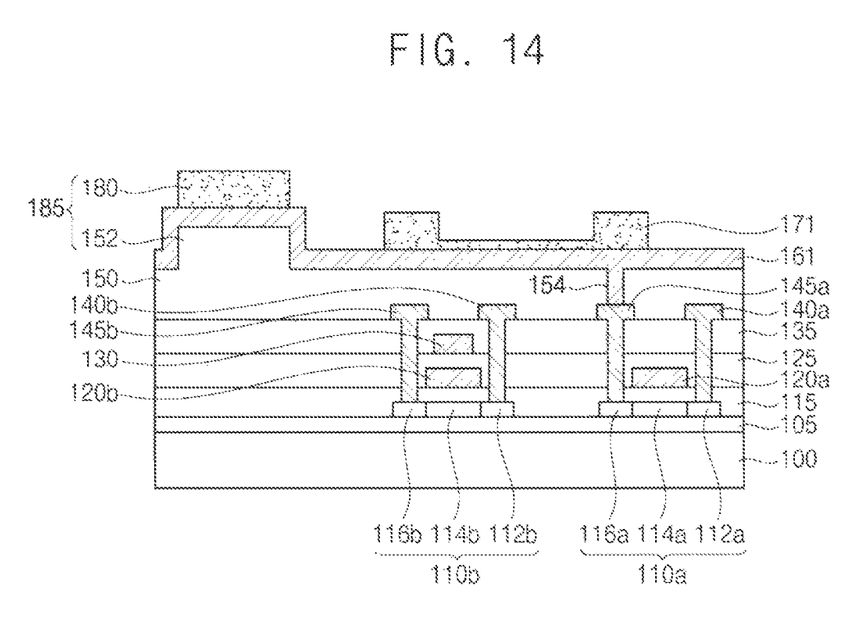

Referring to FIG. 14, a first region 172 in FIG. 13 of the preliminary pixel defining layer 171, which is exposed to light transmitted through the fourth portion 310 of the second mask 300, can be entirely removed to expose the pixel electrode layer 161. A second region 173 in FIG. 13 of the preliminary pixel defining layer 171, which is exposed to light transmitted through the fifth portion 320 of the second mask 300, can be partially removed. A third region 174 in FIG. 13 of the preliminary pixel defining layer 171, which is not exposed to light blocked by the sixth portion 330 of the second mask 300, can become the pixel defining layer 170 and the second spacer 180. Therefore, a spacer structure 185 including the first spacer 152 and the second spacer 180 can be provided.

Figure 15:
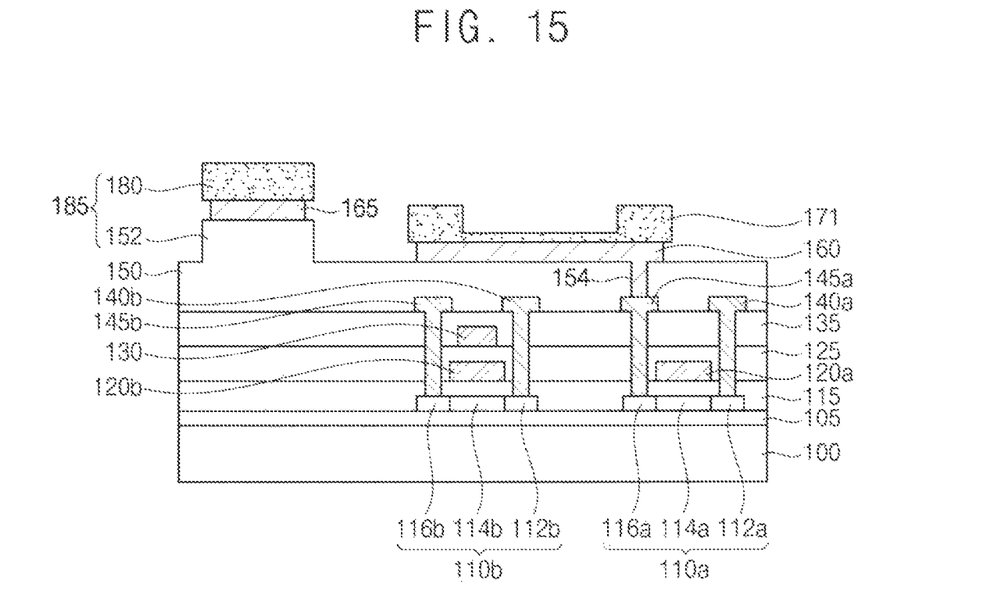

Referring to FIG. 15, the pixel electrode layer 161 is selectively removed using the preliminary pixel defining layer 171 and the second spacer 180 as masks to form the pixel electrode 160 and an auxiliary electrode 165. For example, the pixel electrode 160 and the auxiliary electrode 165 are formed by a wet etching process. A portion of the preliminary pixel defining layer 171 and the exposed pixel electrode layer 161 can be removed by continuing the etching process to form the pixel electrode 160 and the auxiliary electrode 165. The auxiliary electrode 165 can be located between the first spacer 152 and the second spacer 180, and the pixel electrode 160 can be located on the insulation layer 150 to be electrically connected to the first drain electrode 145a. Here, the preliminary pixel defining layer 171 on a center portion of the pixel electrode 160 can have a relatively thin thickness, and the preliminary pixel defining layer 171 on an edge portion of the pixel electrode 160 and on the second spacer 180 can have a relatively thick thickness.

Figure 16:
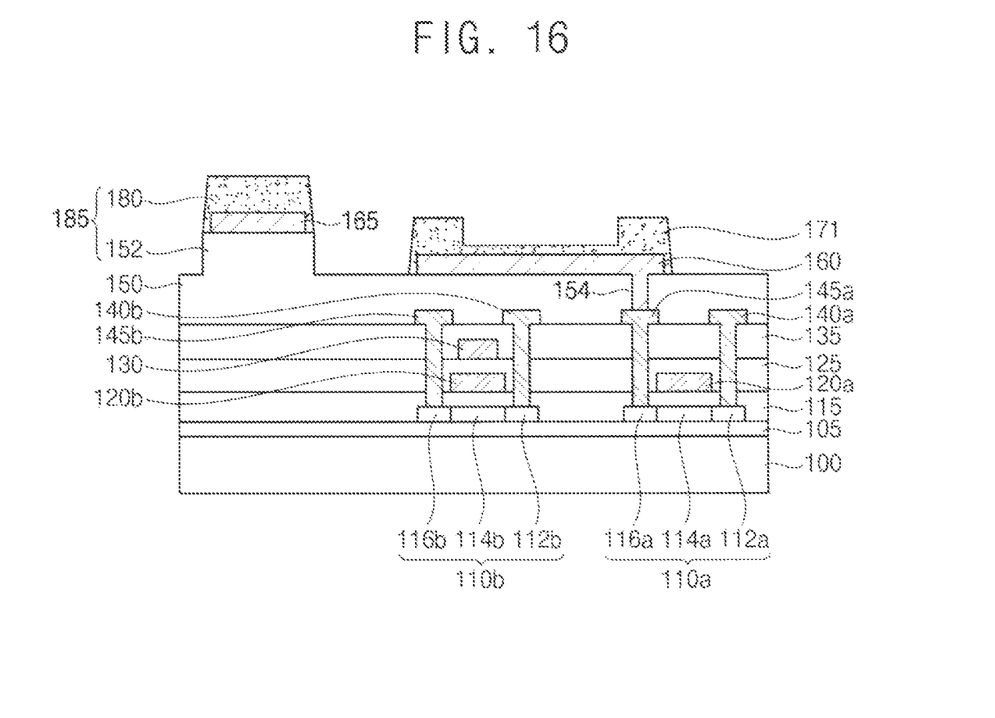

Referring to FIG. 16, the preliminary pixel defining layer 171 and the second spacer 180 are cured. As illustrated in FIG. 15, when a side of the pixel electrode 160 and a side of the auxiliary electrode 165 are exposed, according to succeeding processes, the pixel electrode 160 and the auxiliary electrode 165 can be electrically connected to a common electrode 195 in FIG. 18 formed on the pixel electrode 160 and the auxiliary electrode 165. Therefore, a high temperature curing process can be required to melt and reflow the photosensitive material of the preliminary pixel defining layer 171 and the second spacer 180 for a predetermined time. Therefore, the preliminary pixel defining layer 171 can substantially cover the side of the pixel electrode 160, and the second spacer 180 can substantially cover the side of the auxiliary electrode 165.

Figure 17:
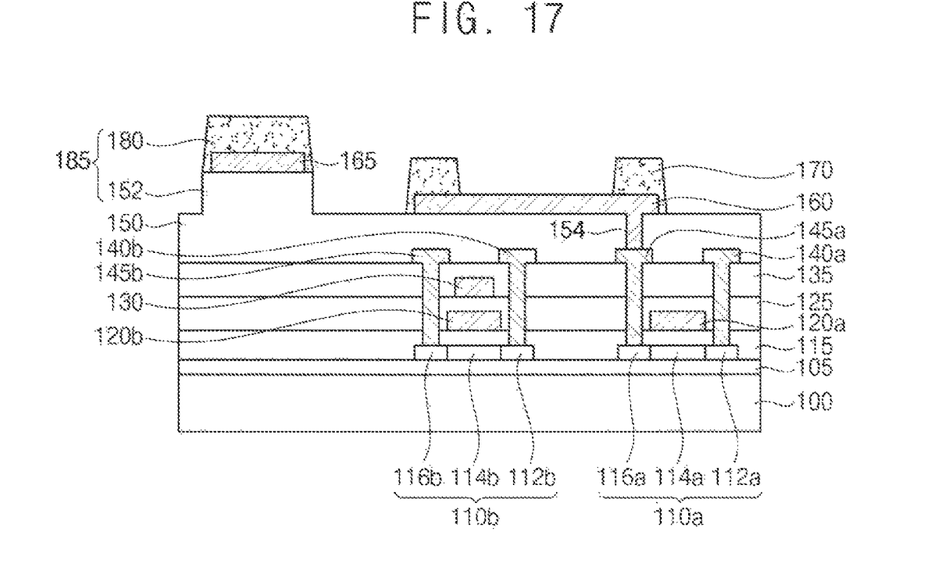

Referring to FIG. 17, the preliminary pixel defining layer 171 on the center portion of the pixel electrode 160 is entirely removed to expose the pixel electrode 160. The pixel defining layer 170 and the second spacer 180 can be provided. For example, the preliminary pixel defining layer 171 on the center portion of the pixel electrode 160 is removed by an ashing process. Therefore, the pixel defining layer 170 and the second spacer 180 can be formed, and the spacer structure 185 including the first spacer 152 and the second spacer 180 can be provided.

In typical methods of manufacturing a display substrate, each of a process for forming a pixel defining layer and a process for forming a spacer can use different masks to each other. Therefore, at least two masks can be required so that a manufacturing process can be more complex and a manufacturing cost can be increased. Moreover, in some typical methods of manufacturing a display substrate, a volume difference between a pixel defining layer and a spacer can induce a thickness difference between the pixel defining layer and the spacer. However, inducing the notable thickness difference between the pixel defining layer and the spacer just using the volume difference can be substantially difficult.

As mentioned above, according to example embodiments, the pixel defining layer 170 and the second spacer 180 can be formed using only one mask (e.g., a halftone mask or a halftone slit mask). Furthermore, before the formation of the pixel defining layer 170 and the second spacer 180, the first spacer 152 can be integrally formed with the insulation layer 150. Therefore, the number of masks for forming the pixel defining layer 170 and the spacer structure 185 can be decreased to reduce a manufacturing cost and to simplify a manufacturing process, and the spacer structure 185 having an enough thickness distinct from the pixel defining layer 170 can be formed.

Figure 18:
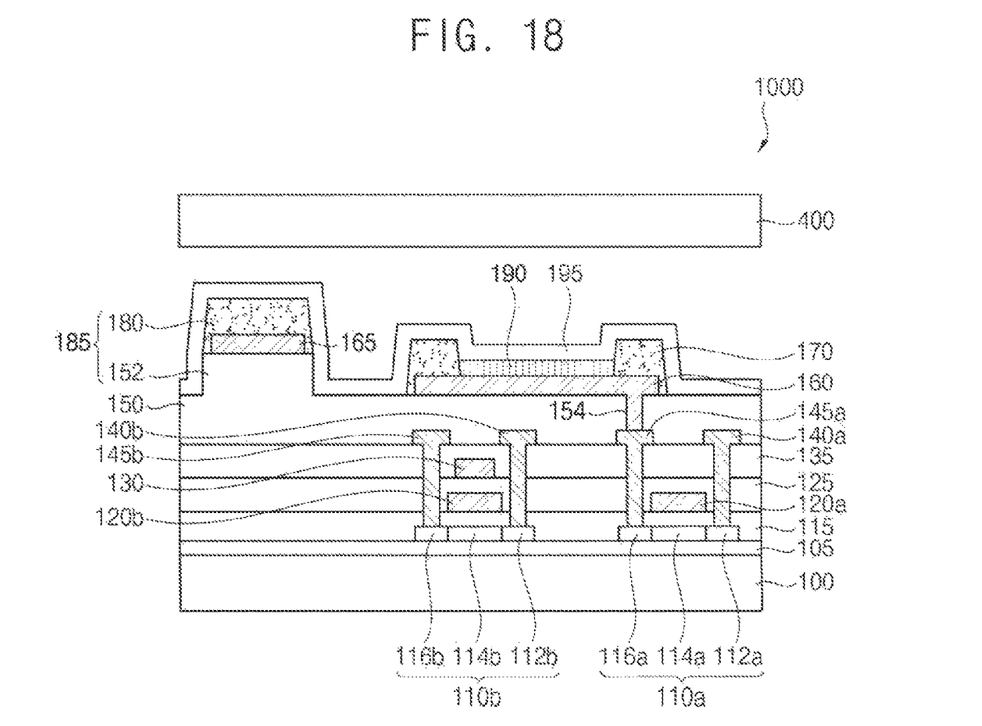
FIG. 18 is a cross-sectional view illustrating a display device including a display substrate in accordance with example embodiments.

FIG. 18 is a cross-sectional view illustrating a display device 1000 including a display substrate in accordance with example embodiments. For example, FIG. 18 illustrates an OLED display including the display substrate 10 explained with reference to FIG. 1.

Detailed descriptions on elements and/or structures of the display substrate 10 illustrated with reference to FIG. 1 will be omitted.

Referring to FIG. 18, the display device 1000 includes an organic light emitting layer 190 and a common electrode 195 sequentially stacked on the display substrate 10.

The organic light emitting layer 190 can be disposed on the pixel electrode 160. The organic light emitting layer 190 can be formed of a host material excited by holes and electrons, and a dopant material for facilitating an absorbance and a release of energy and improving a light emitting efficiency.

In some example embodiments, the display device 1000 further includes a hole transport layer (HTL) interposed between the pixel electrode 130 and the organic light emitting layer 190. The display device 1000 can further includes an electron transport layer (ETL) interposed between the common electrode 195 and the organic light emitting layer 190.

The HTL can be formed of a hole transport material, e.g., 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole, or a combination thereof.

The ETL can be formed of an electron transport material, e.g., tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), triazole (TAZ), phenylquinozaline, or a combination thereof.

The common electrode 195 can be disposed on the organic light emitting layer 190, the pixel defining layer 170, the second spacer 180, and the insulation layer 150. The common electrode 195 can face the pixel electrode 160 with respect to the organic light emitting layer 190. For example, the common electrode 195 is formed of a metal having a relatively low work function such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), or alloys thereof.

In example embodiments, the pixel electrode 160 and the common electrode 195 are provided as an anode and a cathode of the display device 1000, respectively.

In example embodiments, an encapsulation substrate 400 is disposed over the common electrode 195. The encapsulation substrate 400 can face the base substrate 100. For example, the encapsulation substrate 400 includes a transparent substrate such as a glass substrate, a quartz substrate, a transparent plastic substrate, etc, similar to the base substrate 100. In some example embodiments, an encapsulation film, instead of the encapsulation substrate 400, is disposed over the common electrode 195 to cover the display substrate. For example, the encapsulation film includes at least one organic layer and at least one inorganic layer which are stacked.

The display substrates and the display devices according to example embodiments can be applied to various electronic devices. For example, the display substrates and the display devices are applied to computers, notebooks, cell phones, smartphones, smart pads, personal media players, personal digital assistances, MP3 players, digital cameras, video camcorders, etc.

Although the inventive technology has been described, those skilled in the art will readily appreciate that many modifications are possible in the example embodiments without materially departing from the novel teachings and advantages of the present inventive concept.

What is claimed is:

1. A display substrate comprising:
a pixel circuit disposed over a base substrate;
an insulation layer disposed over the base substrate and overlapping the pixel circuit in a depth dimension of the display substrate;
a pixel electrode disposed over the insulation layer and electrically connected to the pixel circuit;
a pixel defining layer disposed over the insulation layer, the pixel defining layer formed over a portion of the pixel electrode; and
a spacer structure separately located a distance perpendicular to the depth dimension from the pixel electrode and pixel defining layer and the spacer structure having a height from the insulation layer greater than a height of the pixel defining layer from the insulation layer, the spacer structure including a first spacer and a second spacer disposed over the first spacer, the first spacer being separated from the pixel circuit and disposed over the insulation layer, wherein the first spacer is integrally formed with the insulation layer.

2. The display substrate of claim 1, wherein the second spacer has a thickness that is the same as that of the pixel defining layer.

3. A display substrate comprising:
a pixel circuit disposed over a base substrate;
an insulation layer disposed over the base substrate and overlapping the pixel circuit in a depth dimension of the display substrate;
a pixel electrode disposed over the insulation layer and electrically connected to the pixel circuit;
a pixel defining layer disposed over the insulation layer, the pixel defining layer formed over a portion of the pixel electrode; and
a spacer structure separately located a distance perpendicular to the depth dimension from the pixel electrode and pixel defining layer and the spacer structure having a height from the insulation layer greater than a height of the pixel defining layer from the insulation layer, the spacer structure including a first spacer and a second spacer disposed over the first spacer, the first spacer being separated from the pixel circuit and disposed over the insulation layer, wherein the second spacer is formed of a material that is the same as the pixel defining layer.

4. A display substrate comprising:
a pixel circuit disposed over a base substrate;
an insulation layer disposed over the base substrate and overlapping the pixel circuit in a depth dimension of the display substrate;
a pixel electrode disposed over the insulation layer and electrically connected to the pixel circuit;
a pixel defining layer disposed over the insulation layer, the pixel defining layer formed over a portion of the pixel electrode;
a spacer structure separately located a distance perpendicular to the depth dimension from the pixel electrode and pixel defining layer and the spacer structure having a height from the insulation layer greater than a height of the pixel defining layer from the insulation layer, the spacer structure including a first spacer and a second spacer disposed over the first spacer, the first spacer being separated from the pixel circuit and disposed over the insulation layer; and
an auxiliary electrode disposed between the first and second spacers, wherein the auxiliary electrode is formed of a material that is the same as the pixel electrode.

5. The display substrate of claim 4, wherein the pixel defining layer covers a side of the pixel electrode, and wherein the second spacer covers a side of the auxiliary electrode.

6. A method of manufacturing a display substrate, the method comprising:
forming a pixel circuit over a base substrate;
forming an insulation layer over the base substrate and overlapping the pixel circuit in a depth dimension of the display substrate;
patterning the insulation layer via a first mask to form a contact hole exposing a portion of the pixel circuit and to form a first spacer separated from the pixel circuit;
forming a pixel electrode layer over the insulation layer;
forming a preliminary pixel defining layer over the pixel electrode layer; and
patterning the preliminary pixel defining layer and the pixel electrode layer via a second mask to form a second spacer over the first spacer, and to form a pixel electrode and a pixel defining layer over the insulation layer and the pixel circuit,
wherein the first and second spacers are located at a distance separate from the pixel electrode and pixel defining layer, and wherein the first and second spacers have a combined height from the insulation layer that is greater than a height of the pixel defining layer from the insulation layer.

7. The method of claim 6, wherein the first mask includes a first portion configured to transmit light, a second portion configured to partially transmit light, and a third portion configured to block light.

8. The method of claim 7, wherein the first portion corresponds to the contact hole of the insulation layer, and wherein the third portion corresponds to the first spacer of the insulation layer.

9. The method of claim 6, wherein the second mask includes a fourth portion configured to transmit light, a fifth portion configured to partially transmit light and a sixth portion configured to block light.

10. The method of claim 9, wherein the fifth portion is configured to be placed over the pixel electrode, and wherein the sixth portion is configured to be placed over the pixel defining layer and the second spacer.

11. The method of claim 6, wherein patterning the insulation layer comprises:
disposing the first mask over the insulation layer;
exposing the insulation layer to light; and
selectively removing the exposed insulation layer to form the first spacer and the contact hole.

12. The method of claim 6, wherein patterning the preliminary pixel defining layer and the pixel electrode layer comprises:
disposing the second mask over the preliminary pixel defining layer;
exposing the preliminary pixel defining layer to light;
selectively removing the exposed preliminary pixel defining layer; and
selectively removing the pixel electrode layer to form the pixel electrode.

13. The method of claim 12, wherein selectively removing the exposed preliminary pixel defining layer comprises:
selectively removing the exposed preliminary pixel defining layer such that a portion of the exposed preliminary pixel defining layer is configured to be placed over a center portion of the pixel electrode remains with a first thickness, a portion of the exposed preliminary pixel defining layer is configured to be placed over a peripheral portion of the pixel electrode and the first spacer remains with a second thickness greater than the first thickness, and a remaining portion of the exposed preliminary pixel defining layer is removed;

curing the exposed preliminary pixel defining layer; and removing the portion of the exposed preliminary pixel defining layer is configured to be placed over the center portion of the pixel electrode.

14. The method of claim 12, wherein selectively removing the pixel electrode layer comprises forming an auxiliary electrode between the first spacer and the second spacer.

15. The method of claim 6, wherein forming the pixel circuit comprises:

forming an active pattern over the base substrate;

forming a first gate insulation layer over the base substrate so as to cover the active pattern;

forming a first gate electrode over the first gate insulation layer;

forming a second gate insulation layer over the first gate insulation layer so as to cover the first gate electrode;

forming a second gate electrode over the second gate insulation layer;

forming an insulation interlayer over the second gate insulation layer so as to cover the second gate electrode;

forming a plurality of contact holes through the insulation interlayer, the first gate insulation layer and the second gate insulation layer; and forming a source electrode and a drain electrode over the insulation interlayer and filling the plurality of contact holes.

16. A display device comprising:

a pixel circuit disposed over a base substrate;

an insulation layer disposed over the base substrate so as to cover the pixel circuit;

a pixel electrode disposed over the insulation layer and electrically connected to the pixel circuit;

a pixel defining layer disposed over the insulation layer, the pixel defining layer formed over only a portion of the pixel electrode such that at least part of a remaining portion of the pixel electrode is not covered by the pixel defining layer;

a spacer structure located separate from the pixel electrode and pixel defining layer and the spacer structure having a height from the insulation layer that is greater than a height of the pixel defining layer from the insulation layer, the spacer structure including a first spacer and a second spacer disposed over the first spacer, the first spacer being separated from the pixel circuit and disposed over the insulation layer;

an organic light-emitting layer disposed over the remaining portion of the pixel electrode; and a common electrode disposed over the insulation layer, the organic light-emitting layer, the pixel defining layer and the second spacer.

17. The display device of claim 16, wherein the second spacer is formed of a material that is the same as the pixel defining layer, and wherein the second spacer has a thickness that is the same as that of the pixel defining layer.

18. The display device of claim 16, further comprising an auxiliary electrode disposed between the first and second spacers, wherein the auxiliary electrode is formed of a material that is the same as the pixel electrode.

* * * * *